(12) United States Patent
Yang et al.

(10) Patent No.: US 6,784,682 B1
(45) Date of Patent: Aug. 31, 2004

(54) METHOD OF DETECTING SHALLOW TRENCH ISOLATION CORNER THINNING BY ELECTRICAL TRAPPING

(75) Inventors: Tien-Chun Yang, San Jose, CA (US); Nian Yang, San Jose, CA (US); Hyeon-Seag Kim, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 42 days.

(21) Appl. No.: 10/113,259

(22) Filed: Mar. 28, 2002

(51) Int. Cl.[7] .............................................. G01R 31/26
(52) U.S. Cl. ....................... 324/765; 324/158.1; 438/14
(58) Field of Search .............................. 324/765, 158.1, 324/763, 769; 438/14–19; 257/48; 700/110, 121

(56) References Cited

U.S. PATENT DOCUMENTS 6,046,062 A * 4/2000 Huang et al. ................. 438/18
6,576,487 B1 * 6/2003 Wang et al. .................. 438/17

* cited by examiner

*Primary Examiner*—Ernest Karlsen
*Assistant Examiner*—Jimmy Nguyen (57) ABSTRACT

A method and apparatus for testing semiconductors comprising shallow trench isolation (STI) edge structures. An edge intensive shallow trench isolation structure (500) is coupled to a voltage source (310) and a current profile is recorded. A planar structure (600) on the same wafer is coupled to a voltage source and a current profile is recorded. A comparison of current profiles obtained for the two types of structures may indicate the presence and/or extent of STI corner effects. More specifically, a steeper slope for a normalized current versus time plot for an STI edge intensive structure (500) compared to a slope of a normalized plot of a planar structure (600) is indicative of an increased rate of electron trapping in STI corners, which may indicate that the STI corners are too thin. In this novel manner, STI corner thickness is observed in a non-destructive, electrical test process, resulting in higher quality and greater reliability of semiconductors using STI processes.

20 Claims, 12 Drawing Sheets

240 substrate

METHOD OF DETECTING SHALLOW TRENCH ISOLATION CORNER THINNING BY ELECTRICAL TRAPPING

TECHNICAL FIELD

Embodiments of the present invention relate to semiconductor process control, reliability and testing. More particularly, embodiments of the present invention provide a method of detecting shallow trench isolation corner thinning by electrical trapping.

BACKGROUND ART

For reasons of cost improvement, increasing speed of operation, power consumption decreases and other well known reasons, the semiconductor industry is pushing the geometry of integrated circuits to ever smaller sizes. A typical size of the smallest feature on a chip is, for example, 0.18 $\mu$m. As semiconductors are designed for this and smaller geometries, the once dominant isolation technique known as LOCOS, Local-Oxidation of Silicon, is becoming less prominent, and a newer technique known as Shallow Trench Isolation, STI, is becoming the preferred method of isolation.

When compared to LOCOS, STI generally requires a much smaller area to isolate transistors while offering superior latch-up immunity, smaller channel width encroachment and better planarity. LOCOS is generally a very high temperature process, performed at temperatures of approximately 1,000 degrees C. STI generally is processed at significantly lower temperatures, typically around 500 degrees C. LOCOS commonly suffers from two well known characteristics known as bird's beak and encroachment, which do not occur with STI. Further, by separating two active devices by a trench as with STI, the electrical field lines have to travel a longer distance and change direction twice, so they are considerably weakened. Therefore, trenches of sub-micrometer dimensions are adequate for isolation to prevent punch-through and latch-up phenomena. Consequently, STI structures and processes allow for the required isolation at smaller semiconductor process geometries and with smaller structures than does LOCOS.

Unfortunately, STI is generally a more difficult process to control. To some extent, this results from the smaller size and thinner layers of the structures. As a result, process control, and the corollary quality inspections are of critical importance in an STI process.

The well known, industry-wide standard inspection method is to examine sections of a semiconductor wafer with a tunneling electron microscope, TEM, to measure the thickness of the various layers, for example, polysilicon, oxide, metalization, etc.

Unfortunately, such use of the TEM has many undesirable drawbacks. Because it is a destructive test, it can only be applied to a sample of a batch of wafers. Further, it is well known in the industry that process quality and defects vary across a single wafer. This is especially true as the industry moves toward larger wafer sizes, for example, 8 and 12 inch wafers. A TEM inspection can physically only be made at a few points in a wafer. As a result, the quality of the STI generally can only be examined in a rather limited fashion at a few sample points on very few sample wafers. Consequently, it is difficult to gain a thorough understanding of the process, and it is commercially infeasible to test all wafers for process quality.

What is highly sought in the industry, then, is a non-destructive method of testing semiconductors constructed with STI, particularly a method of measuring the oxide thickness.

DISCLOSURE OF THE INVENTION

A method and apparatus for testing semiconductors comprising shallow trench isolation (STI) edge structures are disclosed. An edge intensive shallow trench isolation structure is coupled to a voltage source and a current profile is recorded. A planar structure on the same wafer is coupled to a voltage source and a current profile is recorded. A comparison of current profiles obtained for the two types of structures may indicate the presence and/or extent of STI corner effects. More specifically, a steeper slope for a normalized current versus time plot for an STI edge intensive structure compared to a slope of a normalized plot of a planar structure is indicative of an increased rate of electron trapping in STI corners, which may indicate that the STI corners are too thin. In this novel manner, STI corner thickness may be observed in a non-destructive, electrical test process, resulting in higher quality and greater reliability of semiconductors using STI processes.

BEST MODE FOR CARRYING OUT THE INVENTION

In the following detailed description of the present invention, method of detecting shallow trench isolation corner thinning by electrical trapping, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail so as not to unnecessarily obscure aspects of the present invention.

METHOD OF DETECTING SHALLOW TRENCH ISOLATION CORNER THINNING BY ELECTRICAL TRAPPING

Embodiments of the present invention are described in the context of semiconductor processing and testing. However, it is appreciated that embodiments of the present invention may be utilized in other areas of process quality inspection.

Figure 1:
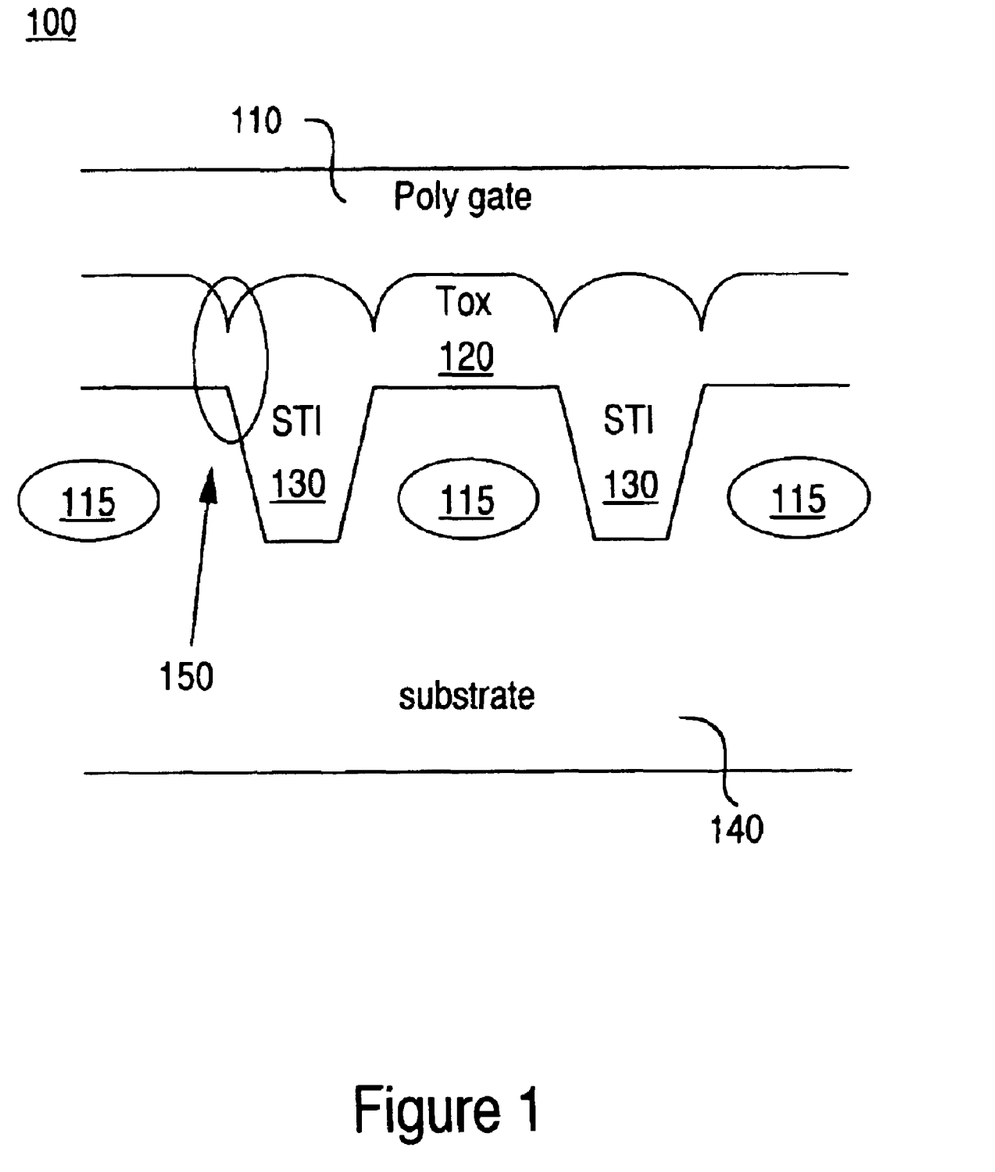
FIG. 1 is an illustration of a shallow trench isolation edge capacitor, according to an embodiment of the present invention.

FIG. 1 is an illustration of a cross section of a shallow trench isolation, or STI, edge capacitor 100, according to an embodiment of the present invention. Structure 100 may comprise a substrate 140, which may be silicon, active areas 115, shallow trench isolation regions 130, a layer of oxide 120 and a polysilicon gate layer 110.

Region 150 of FIG. 1 is referred to as an "STI corner." As the filling oxide 120 and 130 are deposited, they may tend to follow or reflect features of the underlying structures, for example substrate 140. In particular, oxide 120 may form a corner in region 150 substantially "over" or above a corner of the substrate 140 which is part of the shallow trench isolation well 130.

It is well known in the industry that such an STI corner may result in oxide in region 150 being "too" thin for proper function of the semiconductor device. Thinned corners can enhance tunneling current and therefore degrade reliability.

The well known, industry-wide standard method to examine oxide layer 120, for example in region 150, for the presence of an STI cornering effect is to examine sections of a semiconductor wafer with a tunneling electron microscope, TEM.

Unfortunately, such use of the TEM has many undesirable drawbacks. Because it is a destructive test, it can only be applied to a sample of a batch of wafers. Further, it is well known in the industry that process quality and defects vary across a single wafer. This is especially true as the industry moves toward larger wafer sizes, for example, 8 and 12 inch wafers. A TEM inspection can physically only be made at a few points in a wafer. As a result, the quality of the STI generally can only be examined in a rather limited fashion at a few sample points on very few sample wafers. Consequently, it is difficult to gain a thorough understanding of the process, and it is commercially infeasible to test all wafers for process quality.

Figure 2:
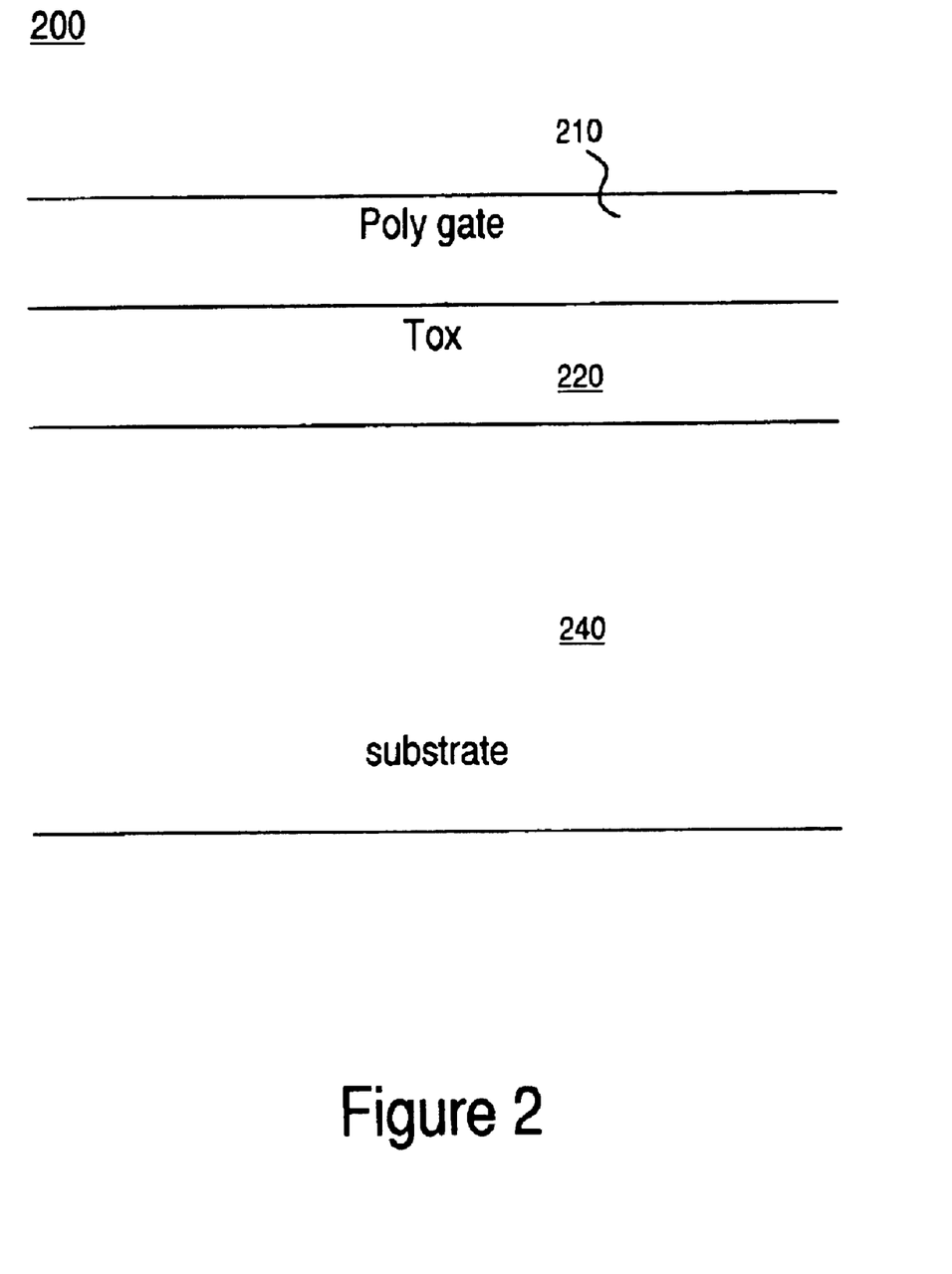
FIG. 2 is an illustration of a lumped capacitor, according to an embodiment of the present invention.

According to an embodiment of the present invention, a lumped capacitor may be constructed as shown in cross section 200 of FIG. 2. Lumped capacitor 200 may comprise a substrate 240, a polysilicon gate 210 and a substantially flat or planar oxide layer 220.

Figure 3:
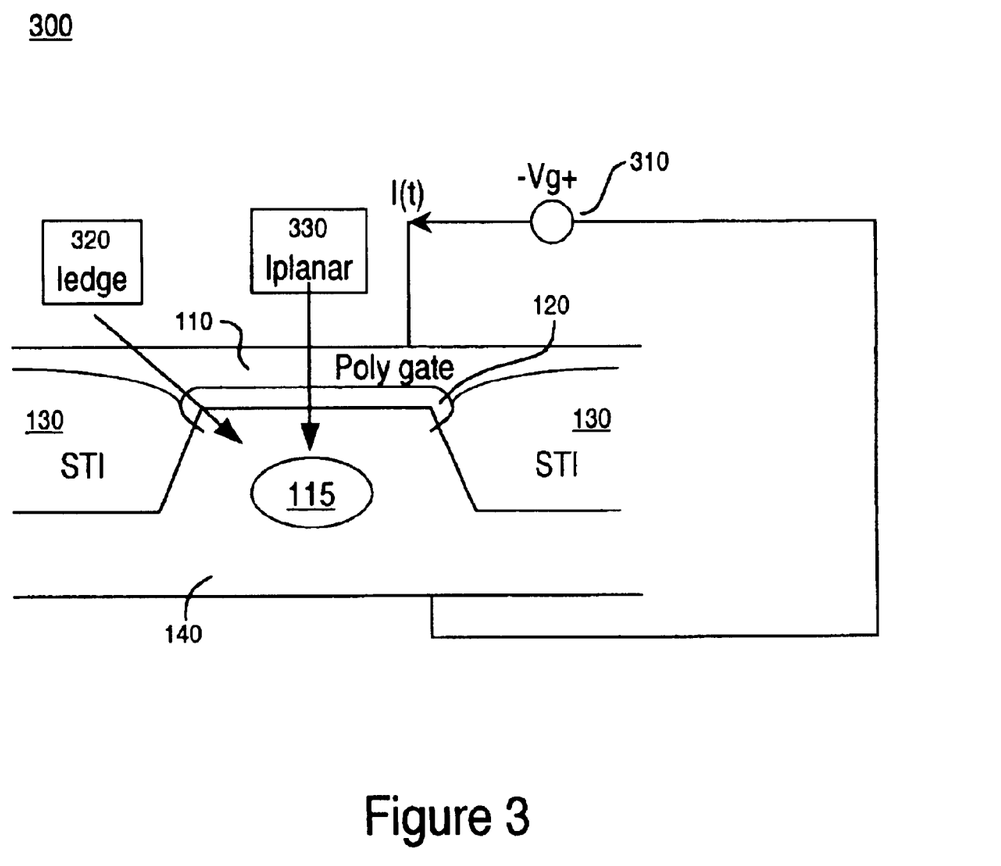
FIG. 3 shows an arrangement comprising a portion of an STI capacitor structure with a voltage applied between the gate and the substrate, according to an embodiment of the present invention.
Figure 4A:
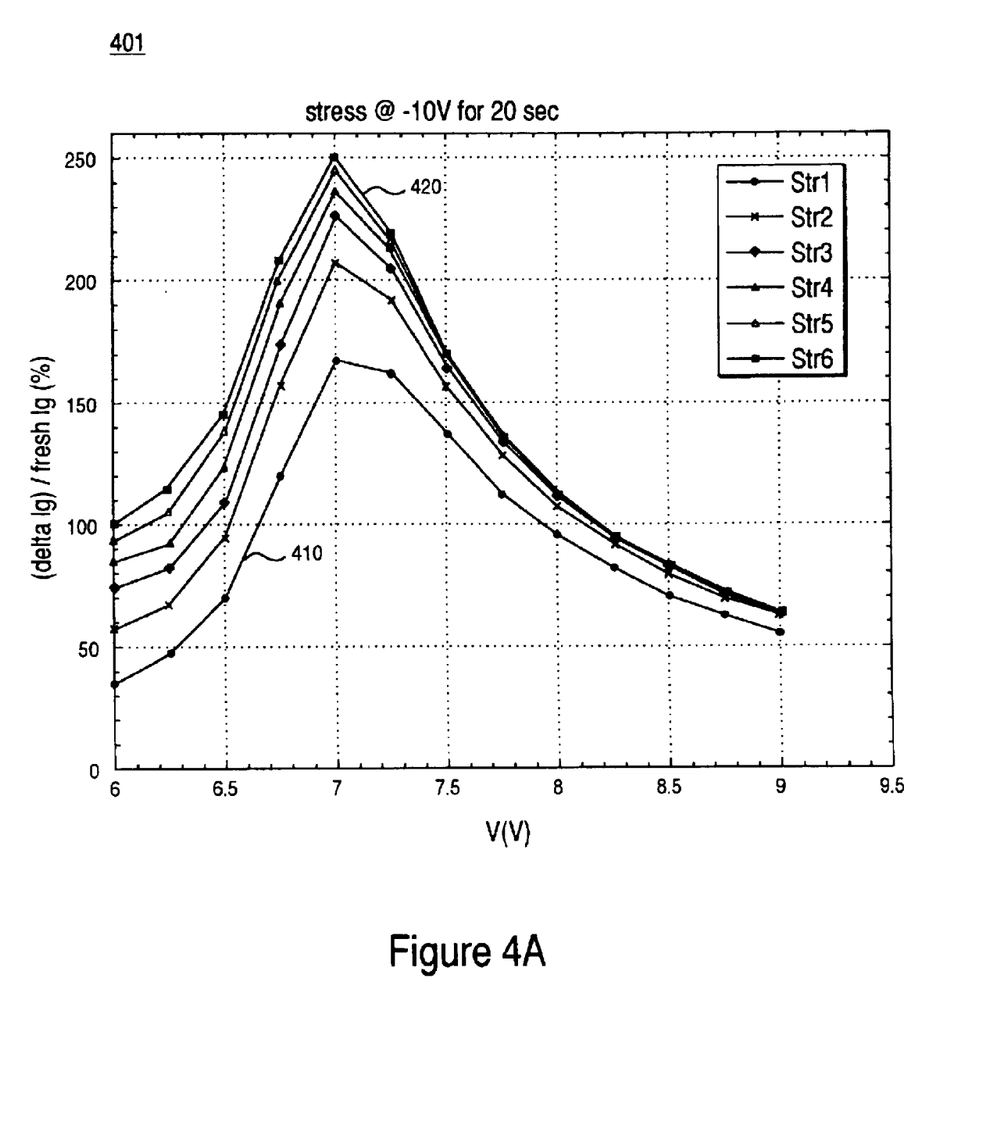
FIG. 4 illustrates a graph presenting normalized current versus time, according to an embodiment of the present invention.
Figure 4B:
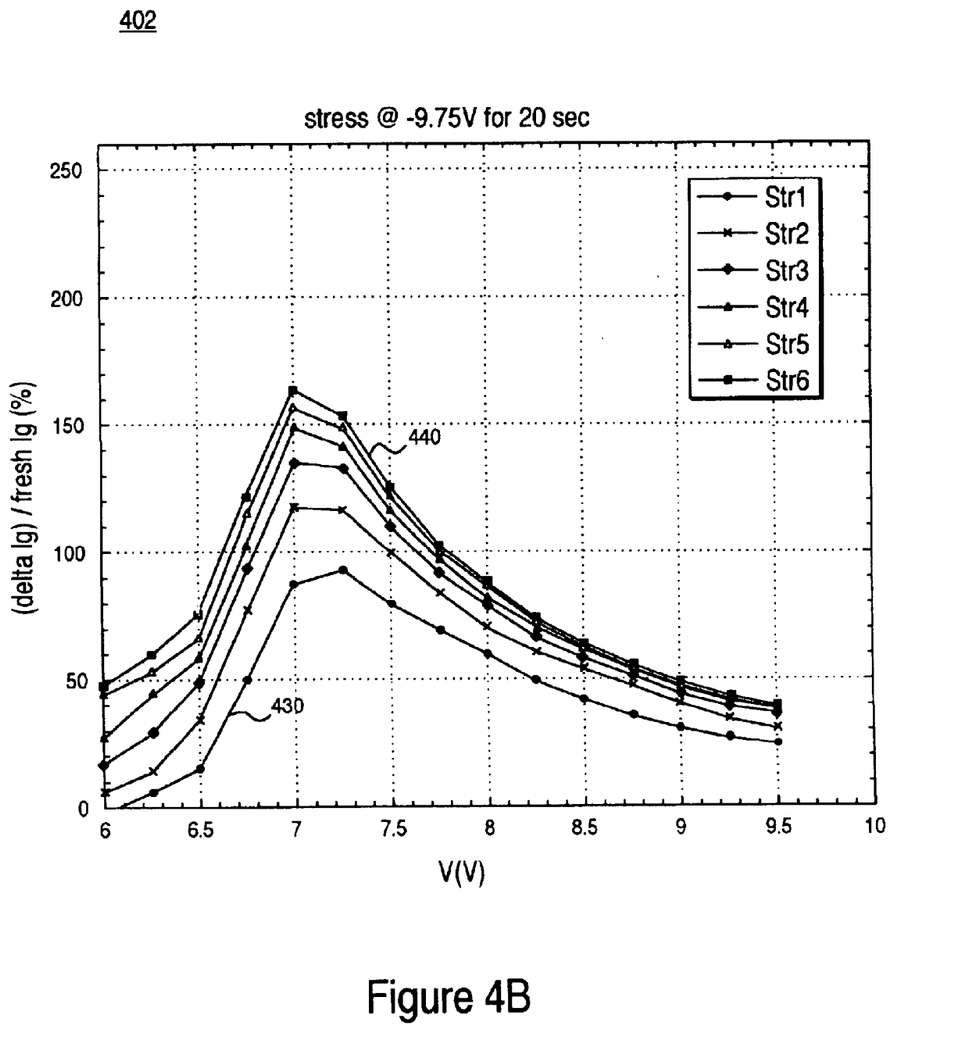
Figure 4C:
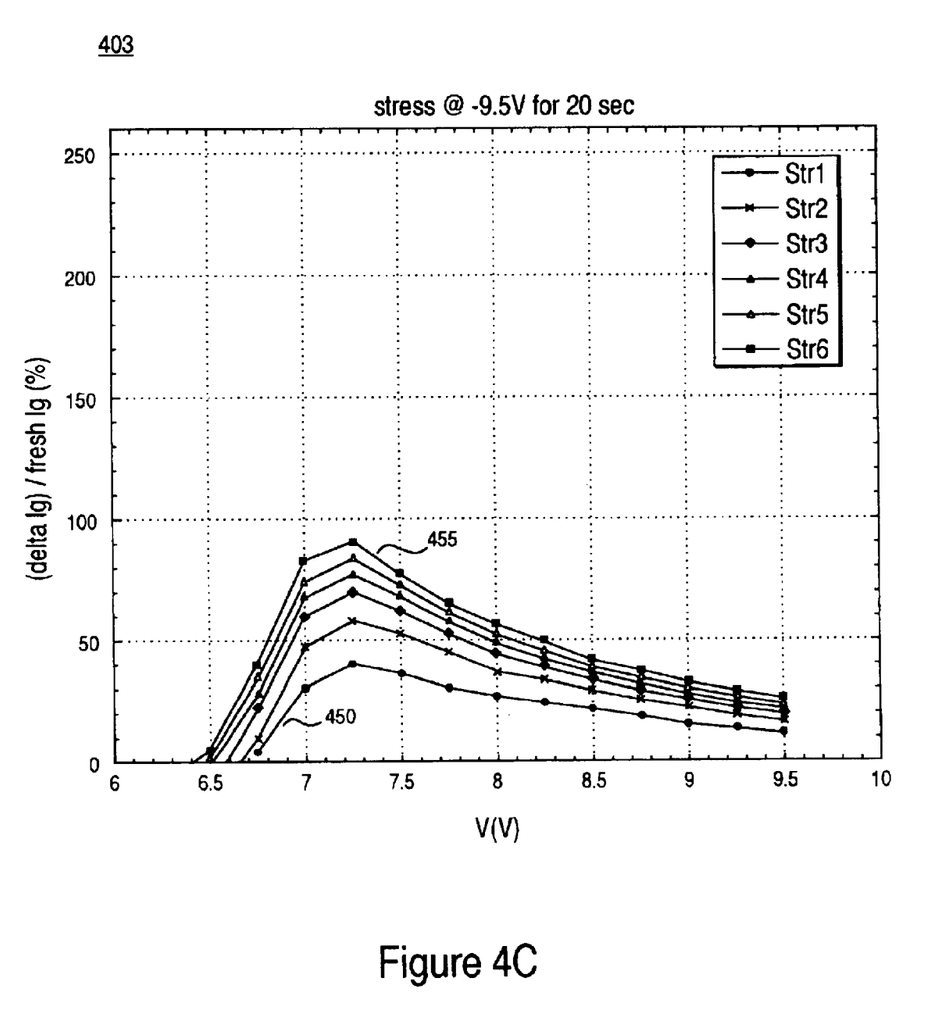
Figure 4D:
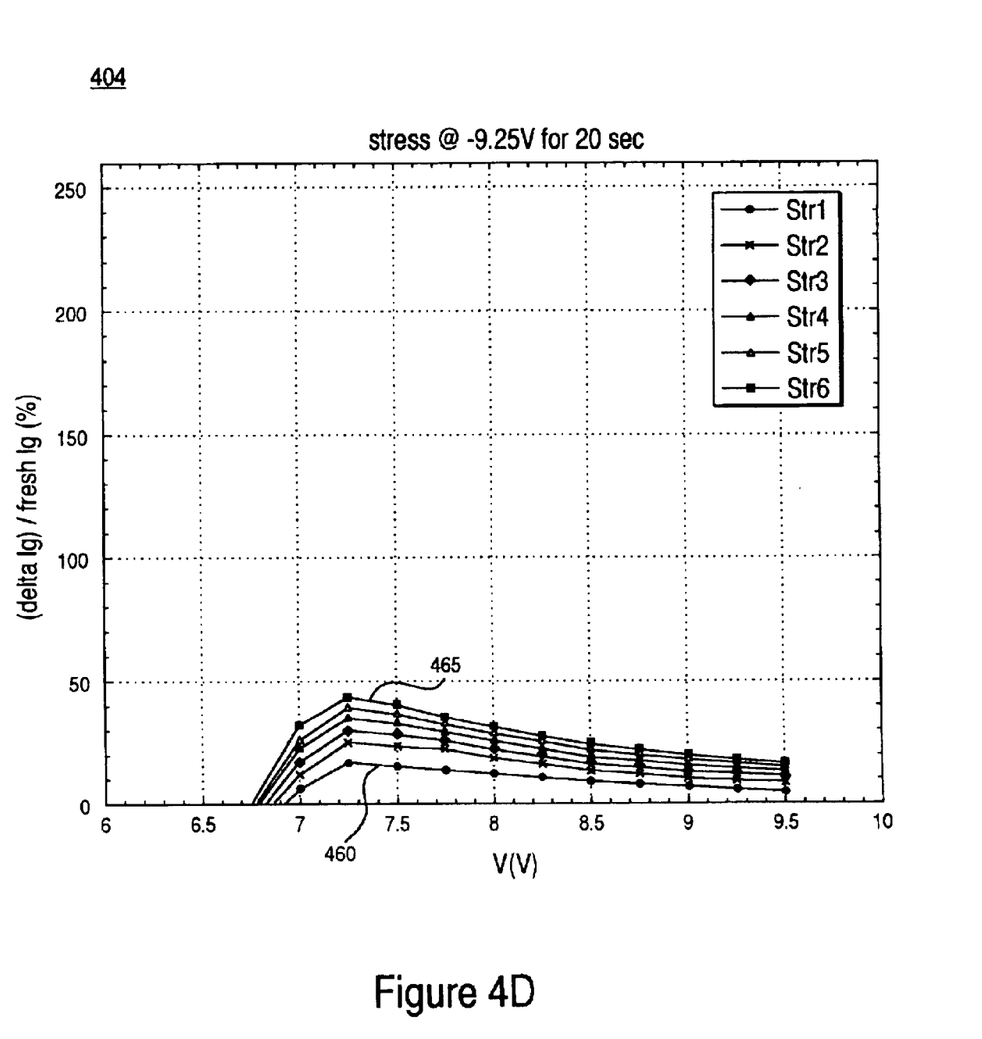

FIG. 3 shows an arrangement 300 comprising a portion of STI capacitor structure 100 with a voltage 310 applied between the gate 110 and the substrate 140, according to an embodiment of the present invention. In response to applied voltage 100, a current "I" may flow. Current I is comprised of a planar component, "Iplanar" 330 and an edge component, "Iedge" 320 such that the total current, Itotal is equal to the sum of Iplanar plus Iedge.

Employing well known techniques, a graph of total current versus time, known as an "I-t curve" is constructed for the arrangement 300. In a similar manner, a voltage is applied between poly gate 210 and substrate 240 of lumped capacitor 200 of FIG. 2, and an I-t curve is constructed for this arrangement (not shown).

The edge component current, Iedge 320, may vary greatly according to the corner effect. For example, if the corner is thin, edge current 320 may increase, resulting in an increased total current. Likewise, if the edge is thick, then edge current 320 may be decreased or negligible, resulting in a decreased total current.

To normalize the data in the I-t curves, the current as a function of time is divided by the initial current, Inormal= I(t)/I(O).

FIG. 4 illustrates a graph 400 presenting normalized current versus time for arrangement 300 and a corresponding arrangement of lumped capacitor 200, according to an embodiment of the present invention.

As discussed above, the data plotted in graph 400 has been normalized by dividing the current as a function of time, I(t) by the initial current, I(O). This normalization serves to eliminate a current factor arising from either a thin corner or a larger capacitor area. The slope corresponds to the electron trapping rate, and correlates to the average electric field and oxide thickness very well.

Curve 410 of FIG. 4 represents a normalized current vs. time plot for a planar oxide, for example oxide 220 of lumped capacitor 200 as shown in FIG. 2. Curve 420 represents a normalized current versus time plot for arrangement 300, which comprises an STI capacitor structure. Further, curve 430 also represents a normalized current versus time plot for arrangement 300.

A difference between curve 420 and curve 430 reflects a difference in the corner thickness of the shallow trench isolation, for example region 150 of FIG. 1.

In Graph 400, the possibly different areas of different capacitors are accounted for by the normalization. As discussed above, a thinner STI corner, for example region 150 of FIG. 1, generally produces a larger current. Yet, curve 430 corresponds to thinner corners than those of curve 420. This is an effect of the normalization of graph 400. The graph data does not directly present current; rather it may reflect a rate of electron trapping in oxide. Consequently, steeper slopes, in absolute value, reflect a higher oxide field and greater trapping rates, which in turn reflects STI corner thinning. Region 440 of graph 400 represents an area generally corresponding to higher slopes, higher electron trapping rates and higher electric fields in the oxide layer.

Referring once again to FIGS. 1 and 2, oxide layer 120 of FIG. 1 and oxide layer 220 of FIG. 2 may advantageously be constructed of nominally the same thickness, according to an embodiment of the present invention. When so constructed, the planar component of current, Iplanar 330 of FIG. 3 may generally be similar to the current though lumped capacitor 200 when excited by a constant voltage source. In general, differences in normalized current between structure 100 and structure 200 may be accounted for by STI edge effects, either thinning or thickening.

Consequently, a comparison between curve 410 of FIG. 4 and a curve for arrangement 300, for example curve 420 or curve 430, may indicate the presence of corner effects, and whether the corners are thicker or thinner than nominal, according to an embodiment of the present invention. More specifically, curve 430, in comparison with curve 410, may indicate that STI corners are thin. Likewise, curve 420, in comparison with curve 410, may indicate STI corner thickening. Specific numerical values of such curves, and in particular the slope of such curves may indicate if the STI corners are too thick or, of primary interest, if the STI corners are too thin for desired levels of reliability or function.

According to an embodiment of the present invention, test-specific structures are included on a semi conductor wafer. It is appreciated that such structures may be located in ways and locations so as to minimize the impact of loss of revenue-generating wafer area, as well as to maximize the effectiveness and coverage of the test structures.

Figure 5:
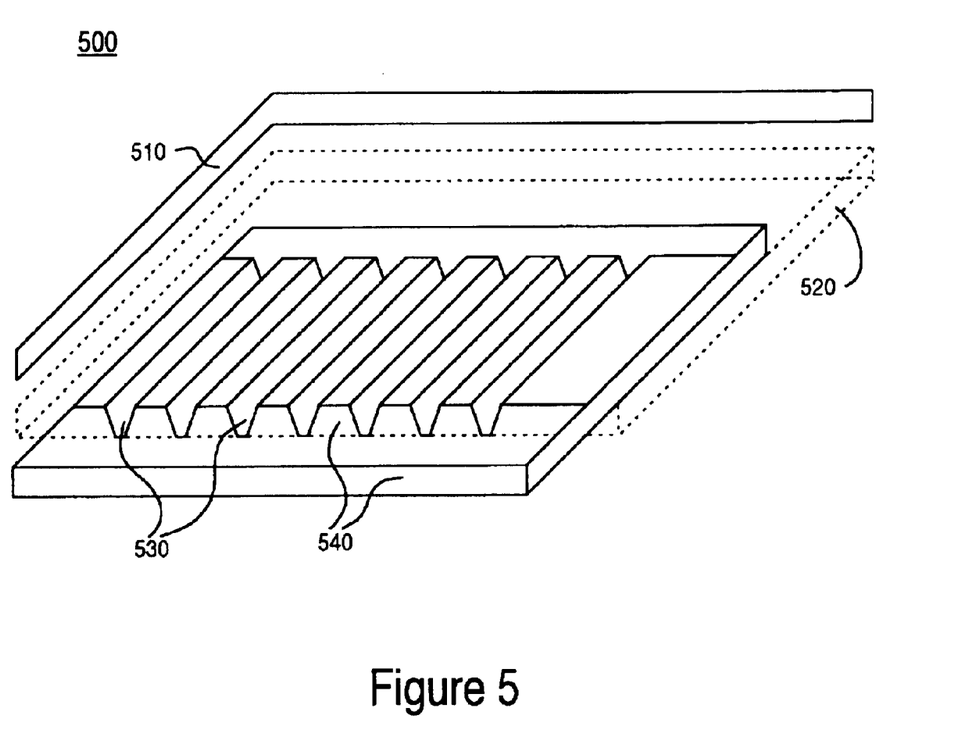
FIG. 5 depicts an STI edge intensive semiconductor structure, according to an embodiment of the present invention.

FIG. 5 depicts an STI edge intensive semiconductor structure 500, according to an embodiment of the present invention. FIG. 5 is a perspective view of a plurality of structures similar to structure 100 of FIG. 1.

Structure 500 includes a substrate 540, a plurality of shallow trench isolation "wells" 530, an oxide layer 520 and a polysilicon gate layer 510. These structures are substantially vertically aligned. It is appreciated that structure 500 may have more or less layers corresponding to the general layer arrangement of the semiconductor wafer containing structure 500. In general, oxide 520 fills STI trench 530, sometimes also known as a well.

Figure 6:
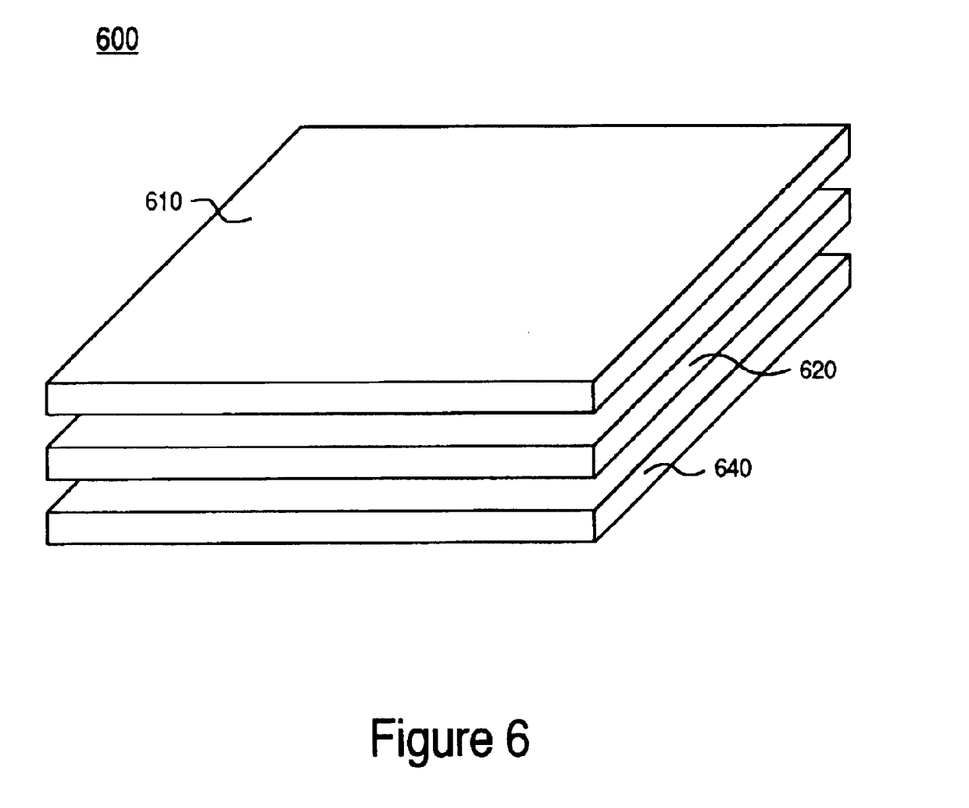
FIG. 6 depicts a lumped capacitor semiconductor structure, according to an embodiment of the present invention.

FIG. 6 depicts a lumped capacitor semiconductor structure 600, according to an embodiment of the present invention. FIG. 6 is a perspective view of an extended structure similar to structure 200 of FIG. 2. Structure 600 includes a substrate layer 640, an oxide layer 620 and a gate layer 610. It is appreciated that structure 600 may have more or less layers corresponding to the general layer arrangement of the semiconductor wafer containing structure 600.

Figure 7:
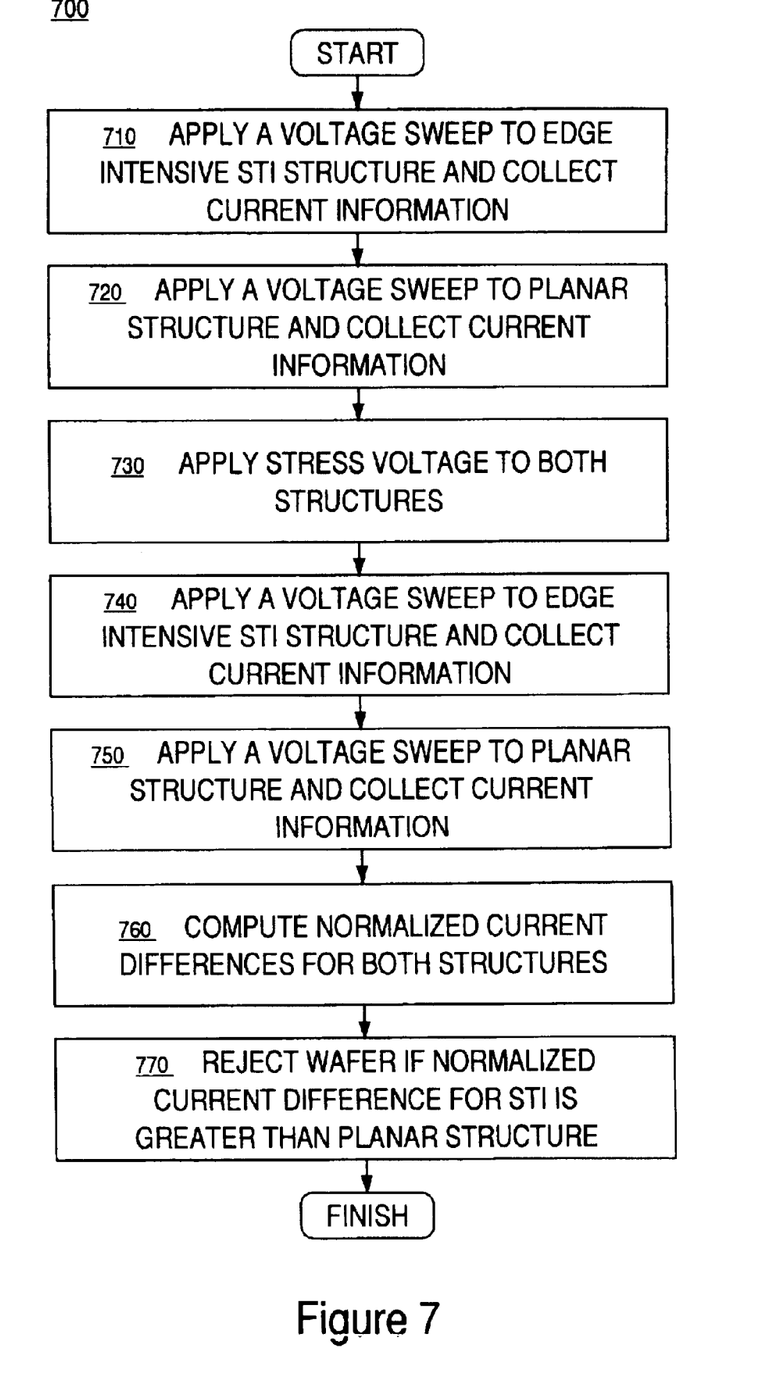
FIG. 7 illustrates a flow diagram of a method for testing semiconductors containing shallow trench isolation, according to an embodiment of the present invention.

FIG. 7 illustrates a flow diagram of a method 700 for testing semiconductors containing shallow trench isolation, according to an embodiment of the present invention.

In step 710, a constant voltage is applied between a gate and a substrate of an edge intensive shallow trench isolation structure, for example structure 500. In step 720, a normalized current versus time plot of behavior of structure 500 is plotted.

In step 730, a constant voltage is applied between a gate and a substrate of a planar semiconductor structure, for example structure 600. In step 740, a normalized current versus time plot of behavior of structure 600 is plotted.

In optional step 750, a wafer containing structures 500 and 600 is rejected if a plot of normalized current versus time for structure 500 has a steeper slope and/or is generally "below" the corresponding plot of normalized current versus time for structure 600. For example, the plot might be in region 440 of FIG. 4. It is appreciated that other comparisons between normalized current versus time plots are well suited to embodiments of the present invention. For example, a wafer may be rejected if the plot for structure 500 is less than 85% of the plot of structure 600.

It is to be appreciated that embodiments of the present invention are well suited to well known methods of representing normalized current versus time information, and that it is not necessary to physically construct a plot or graph to practice embodiments of the present invention. Visual plots are well suited to describe embodiments of the present invention to those skilled in the art. However, other well known forms of information storage and comparison, including direct numerical calculation of slopes, are well suited to embodiments of the present invention.

The best results of method 700 are obtained when method 700 is applied to "virgin" wafers, for example, wafers that have not previously had a voltage or current applied.

In this novel manner, wafers may be non-destructively examined for STI corner thinning in a commercially acceptable manner and time frame. The ability to test large numbers of wafers, and potentially also test multiple areas on a wafer may lead to greater understanding of the STI process, greater quality control, increased reliability of STI semiconductors, greater process yields and more profitable production processes.

Figure 8:
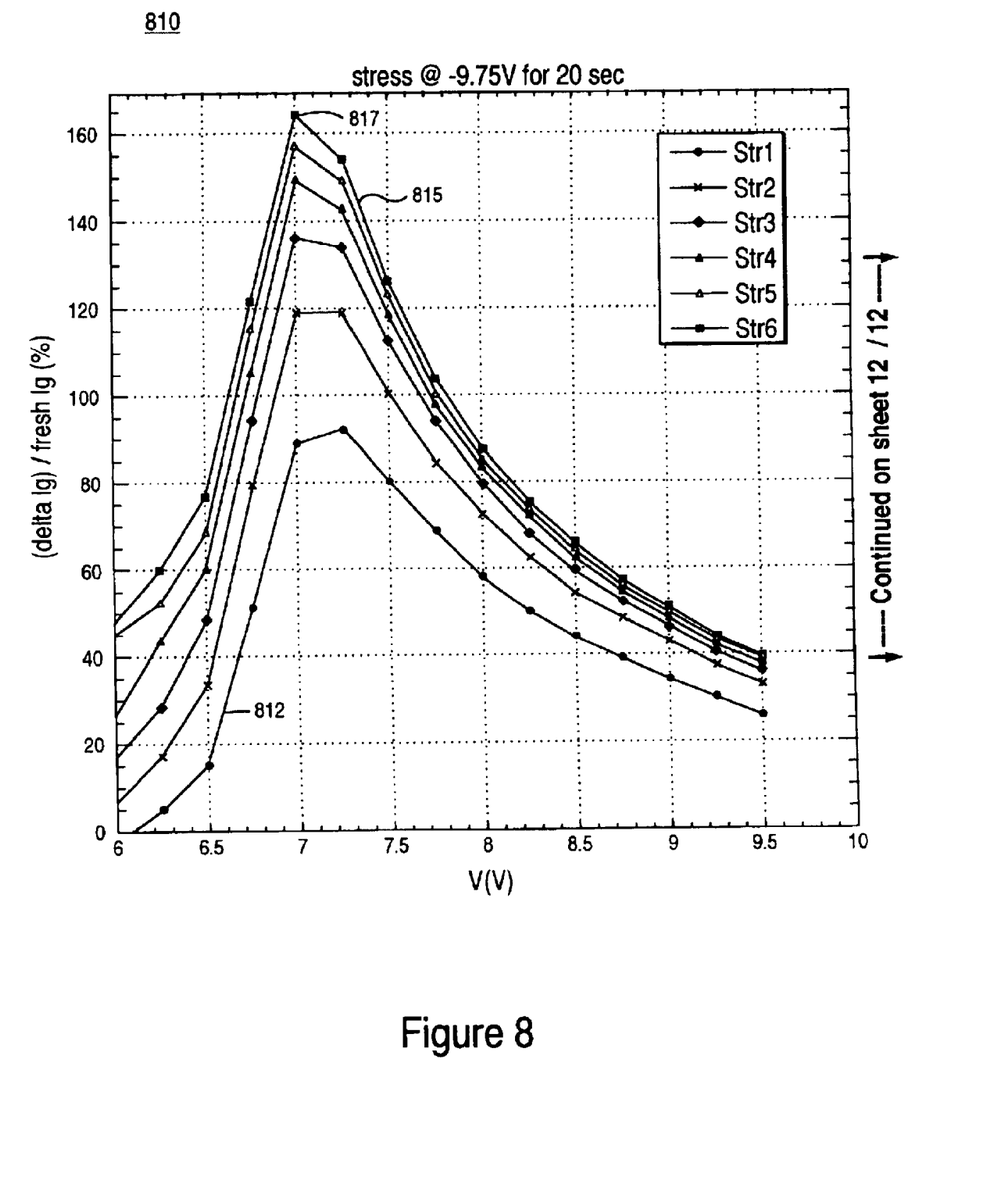
FIG. 8 shows a graph illustrating plots of experimental results of normalized current versus time for several edge intensive STI structures and a substantially planar structure, according to an embodiment of the present invention.

FIG. 8 shows a graph 800 illustrating plots of experimental results of normalized current versus time for several edge intensive STI structures and a substantially planar structure, according to an embodiment of the present invention.

Curve pair 810 represents normalized current versus time plots for two trials of a specific edge intensive STI structure. In a similar fashion, curve pair 820 represents normalized current versus time plots for two trials of a different specific edge intensive STI structure. Curve pair 830 represents normalized current versus time plots for two trials of yet another specific edge intensive STI structure. Curve pair 840 represent normalized current versus time plots for two trials of a planar structure.

As may be seen from graph 800, all of the curves representing edge intensive structures (pairs 810, 820 and 830) have less steep slopes, and are "higher" relative to the curve pair (840) of the planar structure. This indicates that the STI corners are thicker than the lumped oxide of the planar structure, and the reliability of this wafer due to STI corner effects is acceptable. In prior art practice, measuring the corner effects generally would have meant examining sections of the wafer under TEM. Such testing is destructive, and would have destroyed the wafer containing these good structures.

The curves of normalized current versus time, for example curves 810–840, may initially be very similar in value and/or slope. Consequently, better comparisons may be made at time intervals greater than about 20 seconds.

The preferred embodiment of the present invention a method of detecting shallow trench isolation corner thinning by electrical trapping is thus described. While the present invention has been described in particular embodiments, it should be appreciated that the present invention should not be construed as limited by such embodiments, but rather construed according to the below claims.

What is claimed is:

1. A computer implemented method for testing semiconductors comprising shallow trench isolation edge structures, said method comprising:

applying a first voltage to an edge intensive STI structure comprising a high concentration of edges;

collecting current information for said edge intensive STI structure;

applying a second voltage to a planar structure; and collecting current information for said planar structure.

2. The method as described in claim 1 further comprising rejecting a wafer comprising said edge intensive STI structure and said planar structure if normalized current for said edge intensive STI structure is less than normalized current for said planar structure.

3. The method as described in claim 1 further comprising performing said method as a first application of voltage to said edge intensive STI structure.

4. The method as described in claim 1 further comprising performing said method as a first application of voltage to said planar structure.

5. The method as described in claim 1 wherein said first voltage and said second voltage are equal.

6. The method as described in claim 5 wherein said first voltage and said second voltage are constant.

7. The method as described in claim 1 further comprising rejecting a wafer comprising said edge intensive STI structure and said planar structure if normalized current for said edge intensive STI structure is less than a specific percentage of normalized current for said planar structure.

8. The method as described in claim 1 further comprising rejecting a wafer containing said edge intensive STI structure and said planar structure if the absolute value of slope of normalized current versus time for said edge intensive STI structure is greater than the absolute value of slope of normalized current versus time for said planar structure.

9. The method as described in claim 2 wherein the comparison is made at a specific time.

10. The method as described in claim 9 wherein said specific time is at least 20 seconds.

11. A computer controlled integrated circuit tester comprising:

a computer controller for controlling the testing of an integrated circuit;

a voltage source controllable by said computer controller;

a current measuring device coupled to said voltage source and to said computer controller for measuring and storing information of a current supplied by said voltage source;

an integrated circuit probe coupled to said voltage source for applying voltage to said integrated circuit;

said computer controller also for controlling said voltage source applying a first voltage to an edge intensive STI structure comprising a high concentration of edges;

said computer controller also for collecting current information for said edge intensive STI structure;

said computer controller also controlling said voltage source applying a second voltage to a planar structure; and said computer controller also for collecting current information for said planar structure.

12. The integrated circuit tester as described in claim 11 wherein said method further comprises rejecting a wafer comprising said edge intensive STI structure and said planar structure if normalized current for said edge intensive STI structure is less than normalized current for said planar structure.

13. The integrated circuit tester as described in claim 11 wherein said method further comprises performing said method as a first application of voltage to said edge intensive STI structure.

14. The integrated circuit tester as described in claim 11 wherein said method further comprises performing said method as a first application of voltage to said planar structure.

15. The integrated circuit tester as described in claim 11 wherein said first voltage and said second voltage are equal.

16. The integrated circuit tester as described in claim 15 wherein said first voltage and said second voltage are constant.

17. The integrated circuit tester as described in claim 11 wherein said method further comprises rejecting a wafer comprising said edge intensive STI structure and said planar structure if normalized current for said edge intensive STI structure is less than a specific percentage of normalized current for said planar structure.

18. The integrated circuit tester as described in claim 11 wherein said method further comprises rejecting a wafer containing said edge intensive STI structure and said planar structure if the absolute value of slope of normalized current versus time for said edge intensive STI structure is greater than the absolute value of slope of normalized current versus time for said planar structure.

19. The integrated circuit tester as described in claim 12 wherein the comparison is made at a specific time.

20. The integrated circuit tester as described in claim 19 wherein said specific time is at least 20 seconds.

* * * * *